(12) United States Patent
Li et al.

(10) Patent No.: US 7,259,072 B2
(45) Date of Patent: Aug. 21, 2007

(54) SHALLOW LOW ENERGY ION IMPLANTATION INTO PAD OXIDE FOR IMPROVING THRESHOLD VOLTAGE STABILITY

(75) Inventors: Yisuo Li, Glattbrugg (CH); Francis Benistant, Singapore (SG); Kim Hyun Sik, Beacon, NY (US); Zhao Lun, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 76 days.

(21) Appl. No.: 10/828,887

(22) Filed: Apr. 21, 2004

(65) Prior Publication Data
US 2005/0239256 A1    Oct. 27, 2005

(51) Int. Cl.
  *H01L 21/336*    (2006.01)
(52) U.S. Cl. .................. 438/289; 438/217; 438/224; 438/529
(58) Field of Classification Search ................ 438/223, 438/224, 289, 217, 291, 529
See application file for complete search history.

(56) References Cited

U.S. PATENT DOCUMENTS

| | | | | |
|---|---|---|---|---|
| 4,154,626 A | | 5/1979 | Joy et al. ................ 148/1.5 |
| 5,478,762 A | * | 12/1995 | Chao ...................... 438/143 |
| 6,177,333 B1 | | 1/2001 | Rhodes .................... 438/433 |
| 6,468,849 B1 | * | 10/2002 | Efland et al. ............. 438/200 |
| 2001/0021545 A1 | | 9/2001 | Houlihan et al. .......... 438/199 |
| 2002/0179997 A1 | | 12/2002 | Goth et al. ................ 257/514 |
| 2004/0018737 A1 | * | 1/2004 | Kwak ...................... 438/700 |
| 2004/0033658 A1 | * | 2/2004 | Cho et al. ................ 438/231 |

* cited by examiner

*Primary Examiner*—Zandra V. Smith
*Assistant Examiner*—Toniae M Thomas
(74) *Attorney, Agent, or Firm*—Saile Akerman LLC; Stephen B. Ackerman

(57) ABSTRACT

A method is described to fabricate a MOSFET device with increased threshold voltage stability. After the pad oxide and pad nitride are deposited on the silicon substrate and shallow trenches are patterned and the pad nitride removed. $As^+$ or $P^+$ species are then implanted using low energy ions of approximately 5 keV into the pad oxide. Conventional $As^+$ or $P^+$ implant follows the shallow implant to form the n-wells. With this procedure of forming a sacrificial shallow implantation oxide layer, surface dopant concentration variation at pad oxide:silicon substrate interface is minimized; and threshold voltage stability variation of the device is significantly decreased.

16 Claims, 3 Drawing Sheets

SHALLOW LOW ENERGY ION IMPLANTATION INTO PAD OXIDE FOR IMPROVING THRESHOLD VOLTAGE STABILITY

FIELD OF THE INVENTION

The present invention relates generally to a method of forming a semiconductor device, and more particularly to form an MOS transistor with improved threshold voltage stability with the use of a sacrificial ion implantation layer.

DESCRIPTION OF THE PRIOR ART

During the fabrication of shallow trench isolation regions in MOSFET devices, the current practice is to sometimes skip depositing a transfer gate sacrificial silicon dioxide layer to decrease the divot (occur at shallow trench corners) depth and improve surface planarity of shallow trench isolation regions during the inherently isotropic wet etch steps. Large divot depths cause leakage problems, particularly for 100 nm node device generation. Ion implantation to form the n- or p-well in these cases is done through the pad oxide. Because of the thickness variations of pad oxide, which may be in the range of 30-50 Å, the long channel threshold voltage variation will also be quite large.

U.S. Pat. No. 4,154,626 describes a process of making an PET device with improved threshold stability by ion implantation. One method described to form the device consists of forming at least the drain region by introducing ion implantation of an impurity opposite in conductivity to the background impurity such that the peak impurity concentration is located well beneath the surface, and subsequently implanting or diffusing a second impurity within the first region such that the peak impurity concentration is at or adjacent to the surface.

U.S. Pat. No. 6,177,333 B1 describes a method for making trench isolations in semiconductor devices. Isolation trenches are formed, partially filled with a dielectric material such that at least the sidewalls of the trenches are coated with the dielectric film. Ions are implanted into the substrate in regions directly below the isolation trench. The dielectric film on the sidewalls of the trench serve as a mask so that all of the ions implanted below the trench are displaced from the active regions. The trenches are then fully filled with the same or another dielectric material.

U.S. Pat. No. 2002/0179997 A1 describes a process of fabricating an FET device using a simultaneous implantation of the well species at the edge of the device and at the bottom of the shallow trench isolation regions. This procedure while simplifying the process also avoids the problems of corner threshold voltage degradation and leakage across the trench bottom.

U.S. Patent Application Publication No. 2001/0021545 A1 describes a method for eliminating the transfer gate sacrificial oxide. In the proposed method of this application, the pad nitride layer is removed after forming the isolation. Dopant ions are then implanted through the originally deposited pad oxide to form n- and p-wells.

The first three prior arts do not address the problem of well ion implantation through the pad oxide; the fourth one does not offer a solution for minimizing the threshold voltage variation resulting from through-pad-oxide implantation.

SUMMARY OF THE INVENTION

Accordingly, the main object of this invention is to describe a method of forming a semiconductor device with improved threshold voltage stability.

It is yet another object to form a semiconductor device with improved threshold voltage stability using shallow implantation through pad oxide.

Another objective of the invention is to form a semiconductor device with improved threshold voltage stability using a sacrificial ion implantation layer.

In accordance with these objectives, a process is described to form a MOSFET device with increased threshold voltage stability. After forming shallow trench isolation regions using pad nitride/pad oxide mask stack and removing the pad nitride by a selective etch, required dopants are implanted into the pad oxide using low energy implantation. Deep well implantation is then followed. Using this procedure of sacrificial shallow implantation into the pad oxide prior to well implantation, threshold voltage stability variation due to pad oxide thickness variation is significantly decreased.

BRIEF DESCRIPTION OF THE DRAWINGS

The objects, advantages, and details of fabricating a semiconductor device according to this invention will be more clearly understood from the following detailed description taken in conjunction with the accompanying drawings.

DETAILED DESCRIPTION OF THE INVENTION

The objects, advantages, and details of fabricating a semiconductor device according to this invention will be more clearly understood from the following detailed description taken in conjunction with the accompanying drawings.

Figure 1:
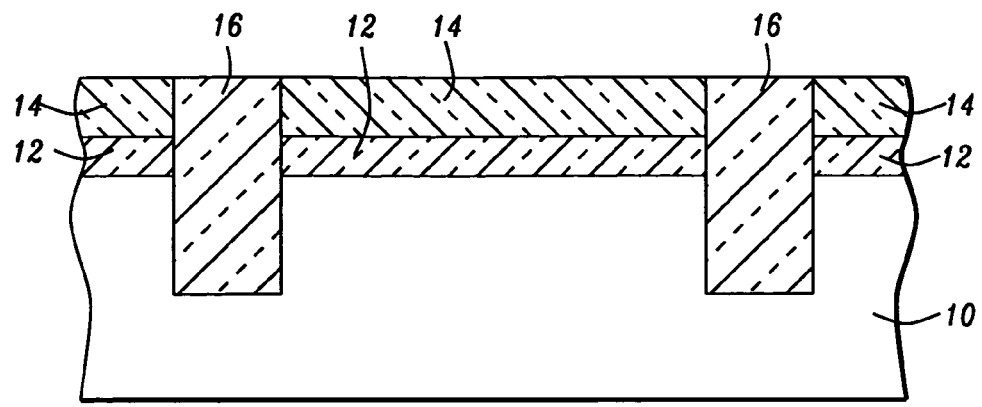
FIG. 1 is a schematic cross-section of a partially fabricated MOSFET device structure after forming shallow trench isolation regions.

For the purpose of fabricating a MOSFET device, firstly shallow trench isolation regions are formed as follows: over a semiconductor substrate 10 such as silicon, using chemical vapor deposition (CVD) or plasma-enhanced CVD methods, deposit pad oxide 12 in the range of approximately about 25-120 Å thick and pad nitride 14 in the range of approximately about 500-2000 Å thick; using a plasma process, pattern the pad nitride using a resist mask; using nitride as a mask etch into pad oxide and into the silicon substrate to the desired depth of the shallow trench, in the range of approximately about 2000-5000 Å using suitable plasma processes known in prior art; fill the shallow trenches with a suitable dielectric material 16 such as silicon dioxide; planarize the structure using etch-back or preferably chemical mechanical polishing (CMP) method. The resulting structure is shown in FIG. 1.

Figure 2:
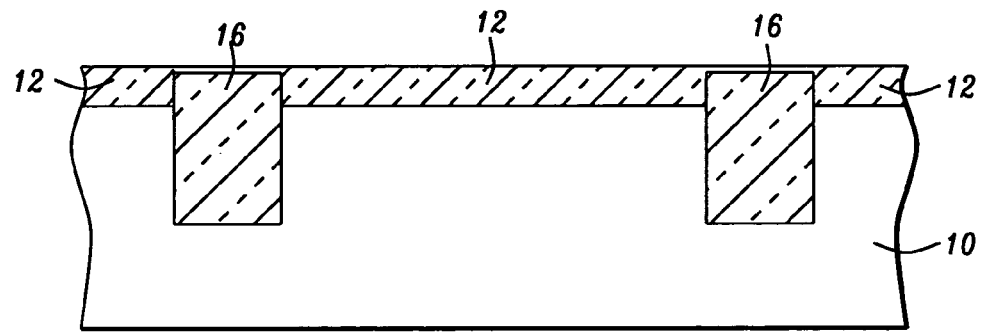
FIG. 2 is a schematic cross-section of a partially fabricated MOSFET device structure after selectively removing the pad nitride layer.

The pad nitride 14 is then selectively removed using either a selective plasma process or a wet etchant such as hot phosphoric acid, as shown in FIG. 2.

Figure 3:
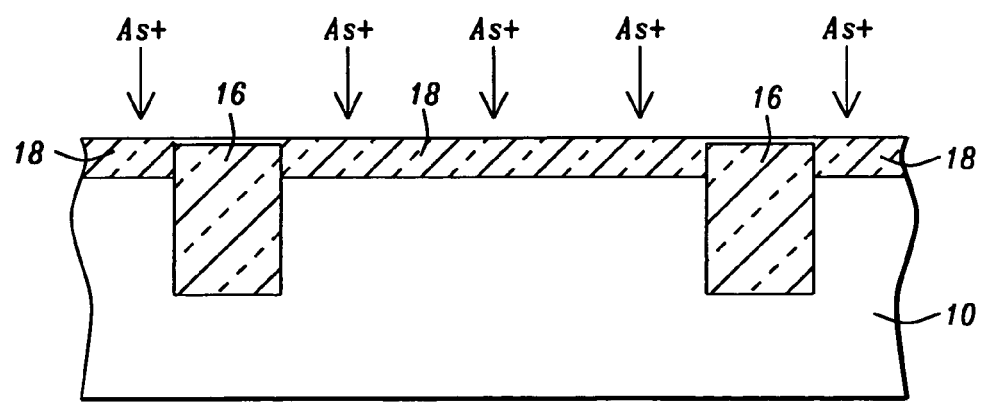
FIG. 3 is a schematic cross-section of a partially fabricated MOSFET device structure showing the sacrificial ion implanted oxide layer.
Figure 4:
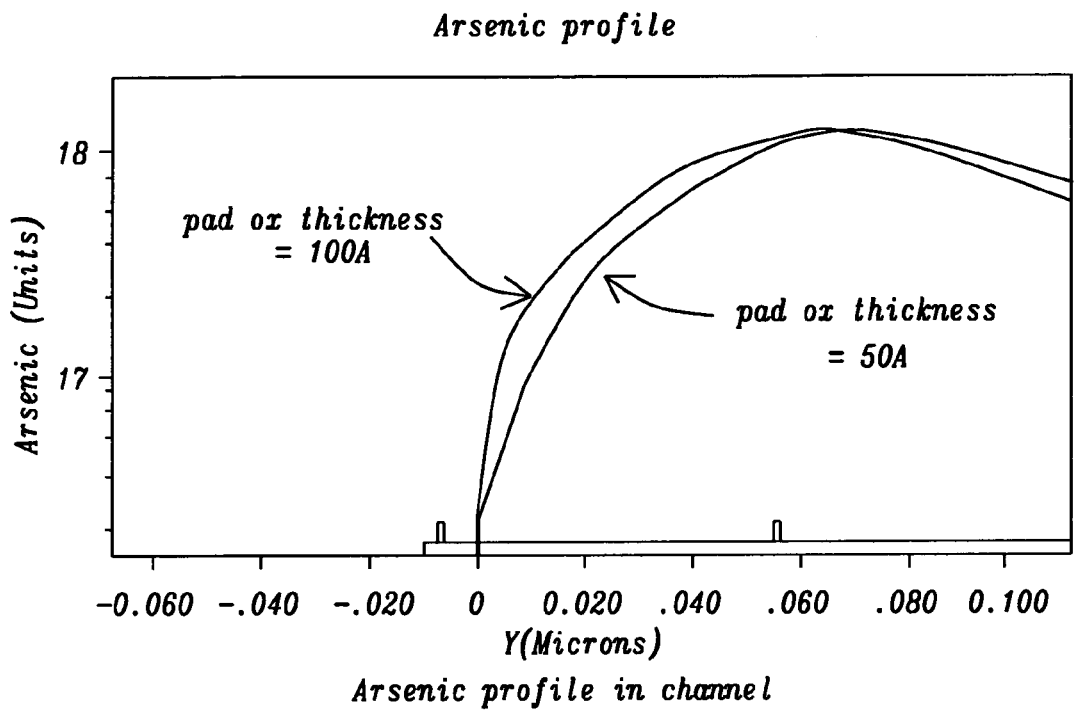
FIG. 4 is a graph showing simulated implantation profile through two oxide thicknesses.
Figure 5:
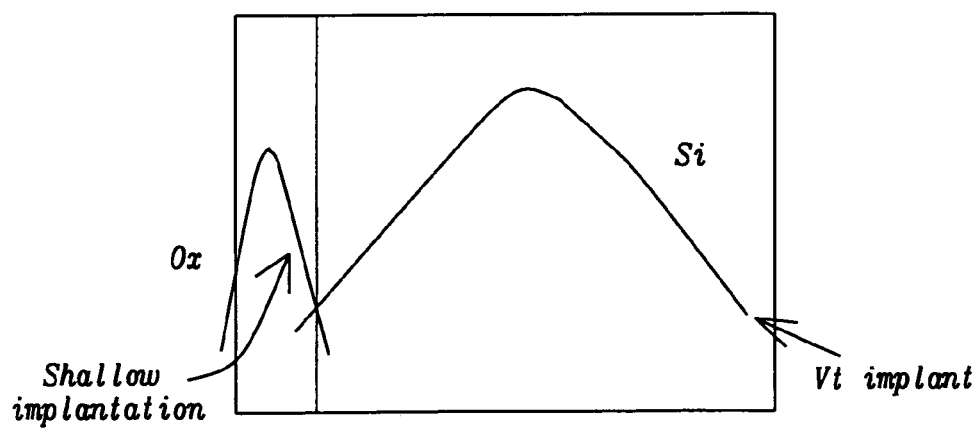
FIG. 5 is a graph showing the shallow implantation profile in the pad oxide and underlying silicon substrate.

After masking the appropriate areas if needed depending on device design (CMOS or MOS), the structure is now exposed to a low energy ion implant beam of As$^+$ ions: energy of approximately about 3-15 keV, dose of approximately about 5E11-1.5E12, and a tilt angle of approximately about 0-15 degrees. The sacrificial implanted oxide layer 18 (so called because the implanted pad oxide is removed prior to gate formation) is shown in FIG. 3. Alternatively B$^+$ ions are used for forming p-wells. The problem of $V_t$ variation due to pad oxide thickness variation is due to a shift in implantation concentration profile. A TCAD simulation profile using arsenic (As) well implantation is shown in FIG. 4 for two pad oxide thicknesses of 50 and 100 Å. It is clear from the figure that the shift in implantation profile is due to pad oxide thickness difference. This shift leads to surface As concentration differences, which in turn leads to $V_t$ shift in the device. In order to balance this $V_t$ shift originating from surface concentration shift, a sacrificial shallow implantation is introduced in this invention. Using low energy implantation, dopants are introduced mainly in the pad oxide, while the tail of the profile is inside the silicon substrate as shown in FIG. 5. Since the long channel $V_t$ is dependent upon the channel surface concentration, which is decided by the tail of shallow implantation profile at oxide:silicon interface in this case, $V_t$ variation is therefore minimized. The shallow profile concentration in the pad oxide is shown in FIG. 5.

Figure 6:
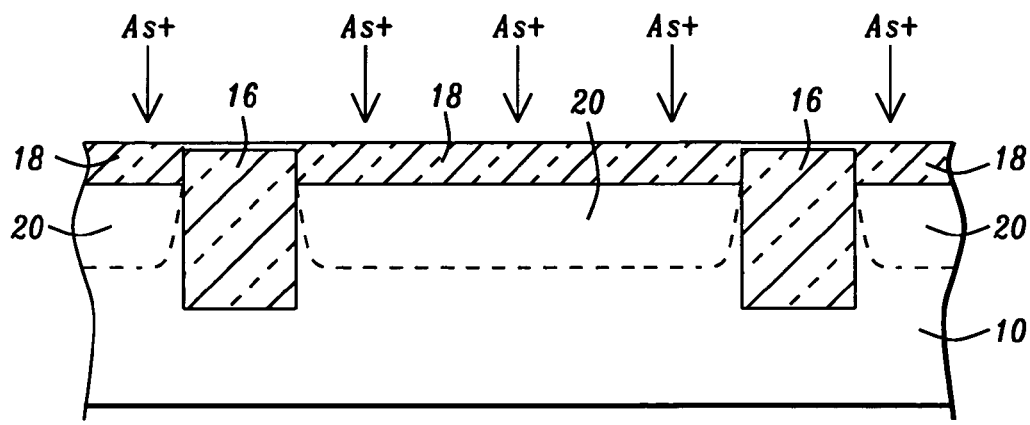
FIG. 6 is a schematic cross-section of a MOSFET device structure after well ion implantation.

The wafer is then exposed to the normal well implant As$^+$ or P$^+$ ion beam: 80-140 keV, 1E13-2E13 ions/cm$^2$, 0-15 degrees of tilt angle to form n-wells (or p-wells) 20 as shown in FIG. 6. The $V_t$ implant profile is shown in FIG. 5.

The $V_t$ values with and without sacrificial shallow implantation are shown in Table I. $V_t$ variation for pad oxide thickness variation in the range of 35-110 Å is 0.489+/− 0.0327 volts without shallow sacrificial implantation, whereas it is 0.522+/−0.007 volts with shallow sacrificial implantation prior to well implantation.

Figure 7:
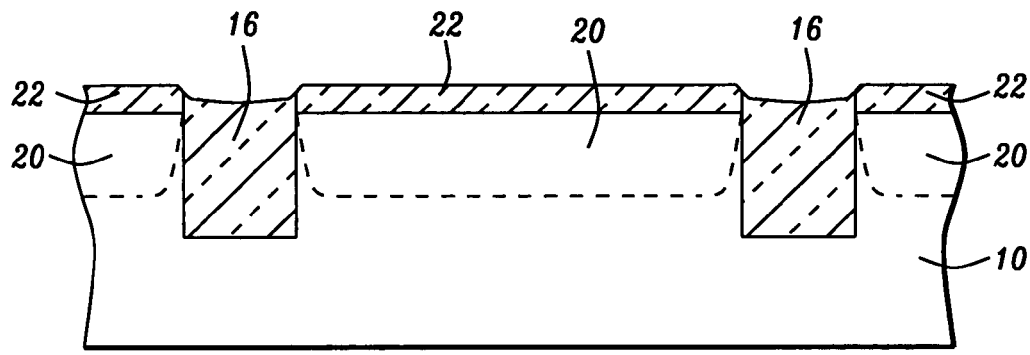
FIG. 7 is a schematic cross-section of a MOSFET device structure after stripping the shallow implanted pad oxide layer and growing the gate oxide layer.

The sacrificial implanted pad silicon dioxide layer 18 is then stripped off in a wet etchant such as dilute hydrofluoric acid which is selective to underlying silicon. Since only one silicon dioxide wet etching step is used, attack of the oxide fill in shallow trenches to form divots, seams, and loss of surface planarity is minimized. The gate dielectric 22 is then grown, as shown in FIG. 7. The gate dielectric layer comprises thermally grown or deposited silicon dioxides or other deposited materials comprising ZrO2, HfO2, and silicates. The gate dielectric layer can be a single layer or a multiple layer stack. Gate dielectric thickness is approximately about 20-100 Å of equivalent silicon dioxide thickness.

Figure 8:
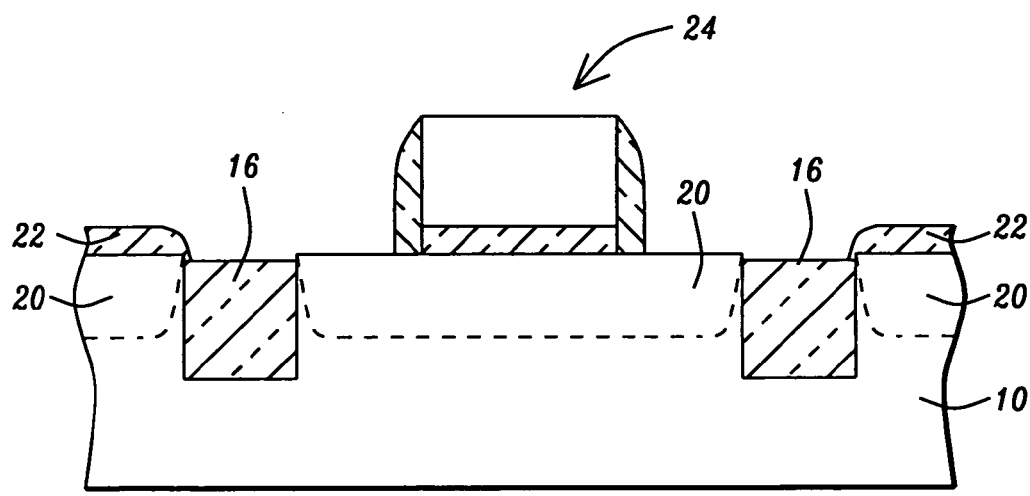
FIG. 8 is a schematic cross-section of a MOSFET device structure after the gate is formed.

The gate structure 24 is then formed using the processes known in prior art. The resulting structure is shown in FIG. 8.

The advantages of this invention over prior art are:

a) Sacrificial low energy shallow implantation through mainly pad oxide stabilizes the pad oxide:silicon substrate interface dopant concentration.

b) Stable interface dopant concentration provides a device with improved long channel threshold voltage stability.

c) The method provides a device with increased $V_t$ stability, without increasing the divot depth or decreasing surface planarity in the shallow trench isolation structures.

d) The method eliminates the use of a sacrificial oxide layer thereby simplifying the number of process steps and minimizing divot depth.

While the invention has been particularly shown and described with reference to the general embodiment and a specific application thereof, it will be understood by those skilled in the art that various changes in form and details to the method and applications may be made without departing from the concept, spirit, and the scope of the invention.

What is claimed is:

1. A method of forming a semiconductor device, the steps comprising:

forming a silicon dioxide layer on a semiconductor substrate;

forming a silicon nitride layer on said silicon dioxide layer;

forming isolation trench regions in said semiconductor substrate;

removing said silicon nitride layer;

first blanket implantation of dopant through said silicon dioxide to form sacrificial blanket implanted silicon dioxide layer;

second blanket implantation of dopant through said sacrificial blanket implanted silicon dioxide layer to form wells; and removing said sacrificial blanket implanted silicon dioxide layer and forming a gate dielectric layer over said semiconductor substrate.

2. The method of forming a semiconductor device according to claim 1, wherein said silicon dioxide layer thickness is approximately about 25 Å-120 Å.

TABLE I

Threshold Voltage, $V_t$, for PMOS Device with/without Sacrificial Shallow As$^+$ Ion Implantation at Various Pad Oxide Thicknesses.

| Pad Oxide Thickness, Å | 110 | 100 | 90 | 80 | 70 | 60 | 35 | 0 |
|---|---|---|---|---|---|---|---|---|
| $V_t$ Without Implantation, volts | 0.531 | 0.517 | 0.503 | 0.490 | 0.477 | 0.465 | 0.436 | 0.400 |
| $V_t$ With Implantation, volts | 0.520 | 0.515 | 0.515 | 0.520 | 0.528 | 0.535 | 0.522 | 0.474 |

3. The method of forming a semiconductor device according to claim 1, wherein said first blanket implanted dopant comprises n- or p-type ions.

4. The method of forming a semiconductor device according to claim 3, wherein said first blanket implanted n-type dopant is As$^+$ or p$^+$ ion.

5. The method of forming a semiconductor device according to claim 4, wherein said blanket implanted As$^+$ dopant implantation energy, dose, and tilt angle are approximately about 2-7 keV, 3E11-7E11 ions/cm², and 5-10 degrees of tilt angle respectively; and for P⁺ ion, implant energy, dose and tilt angle are approximately about 2-15 keV, 3E11-7E11 ions/cm², and 5-10 degrees respectively.

6. The method of forming a semiconductor device according to claim 1, wherein said second blanket implanted dopant comprises n- or p-type ions.

7. The method of forming a semiconductor device according to claim 6, wherein said second blanket implanted n-type dopant is As⁺ or p⁺ ion.

8. The method of forming a semiconductor device according to claim 7, wherein said second blanket implanted As⁺ or P⁺ ion dopant implantation energy, dose, and tilt angle are approximately about 80-140 keV, 1E13-2E13 ions/cm², and 0-15 degrees of tilt angle respectively.

9. A method of forming a semiconductor device, the steps comprising:
   forming a silicon dioxide layer on a silicon substrate;
   forming a silicon nitride layer on said silicon dioxide layer;
   forming isolation trench regions in said silicon substrate and removing said silicon nitride;
   first implantation of As⁺ dopant through said silicon dioxide layer to form sacrificial implanted silicon dioxide layer;
   second implantation of As⁺ dopant through said sacrificial implanted silicon dioxide layer to form wells; and
   removing said sacrificial implanted silicon dioxide layer and forming a gate dielectric layer over said silicon substrate.

10. The method of forming a semiconductor device according to claim 9, wherein said silicon dioxide layer thickness is approximately about 25 Å-120 Å.

11. The method of forming a semiconductor device according to claim 9, wherein said first implanted As⁺ dopant implantation energy, dose, and tilt angle are approximately about 2-7 keV, 3E11-7E11 ions/cm², and 5-10 degrees of tilt angle respectively.

12. The method of forming a semiconductor device according to claim 9, wherein said second implanted As⁺ dopant implantation energy, dose, and tilt angle are approximately about 80-140 keV, 1E13-2E13 ions/cm², and 0-15 degrees of tilt angle respectively.

13. A method of forming a semiconductor device with improved threshold voltage stability, the steps comprising:
   forming isolation trenches in a silicon substrate with steps comprising: forming silicon nitride over silicon dioxide stack on said silicon substrate; and selective removal of said silicon nitride;
   forming a sacrificial implanted silicon dioxide layer by implanting first As⁺ ions into said silicon dioxide layer;
   forming n-well in silicon substrate by second implantation of As⁺ ions through said sacrificial implanted silicon dioxide layer; and
   removing said sacrificial implanted silicon dioxide layer and forming a gate dielectric layer over said silicon substrate.

14. The method of forming a semiconductor device according to claim 13, wherein said silicon dioxide layer thickness is approximately about 25 Å-120 Å.

15. The method of forming a semiconductor device according to claim 13, wherein said first implanted As⁺ dopant implantation energy, ion dose, and tilt angle are approximately about 2-7 keV, 3E11-7E11 ions/cm², and 5-10 degrees of tilt angle respectively.

16. The method of forming a semiconductor device according to claim 13, wherein said second implanted As⁺ dopant implantation energy, dose, and tilt angle are approximately about 80-140 keV, 1E13-2E13 ions/cm², and 0-15 degrees of tilt angle respectively.

* * * * *